(12) United States Patent
Yanagisawa

(10) Patent No.: US 8,786,346 B2
(45) Date of Patent: Jul. 22, 2014

(54) PHASE INTERPOLATOR AND METHOD OF PHASE INTERPOLATION WITH REDUCED PHASE ERROR

(71) Applicant: MegaChips Corporation, Yodogawa-ku (JP)

(72) Inventor: Nobuhiro Yanagisawa, Chiba (JP)

(73) Assignee: MegaChips Corporation, Yodogawa-ku (JP)

( * ) Notice: Subject to any disclaimer, the term of this patent is extended or adjusted under 35 U.S.C. 154(b) by 0 days.

(21) Appl. No.: 13/767,494

(22) Filed: Feb. 14, 2013

(65) Prior Publication Data

US 2013/0207706 A1 Aug. 15, 2013

(30) Foreign Application Priority Data

Feb. 15, 2012 (JP) .................................. 2012-30366

(51) Int. Cl.
*H03K 3/00* (2006.01)
*H04L 7/00* (2006.01)
(52) U.S. Cl.
CPC .................................... *H04L 7/0025* (2013.01)
USPC ............................ 327/254; 327/238; 327/246
(58) Field of Classification Search
CPC .................... H03K 2005/00208; H04L 7/0025
USPC ......... 327/231, 234, 237, 238, 246, 247, 254, 327/403, 404, 407, 408, 409
See application file for complete search history.

(56) References Cited

U.S. PATENT DOCUMENTS

| 6,803,809 | B2 | 10/2004 | Saitoh | |
|---|---|---|---|---|
| 7,180,352 | B2 * | 2/2007 | Mooney et al. | 327/237 |
| 7,498,858 | B2 * | 3/2009 | Desai et al. | 327/246 |
| 2009/0195286 | A1 * | 8/2009 | Rylov | 327/237 |
| 2010/0156465 | A1 * | 6/2010 | Li | 326/93 |

FOREIGN PATENT DOCUMENTS

| JP | A-2003-037458 | 2/2003 |
|---|---|---|
| JP | A-2006-286990 | 10/2006 |
| JP | B2 3880302 | 2/2007 |

* cited by examiner

*Primary Examiner* — Lincoln Donovan
*Assistant Examiner* — Jung H Kim
(74) *Attorney, Agent, or Firm* — Oblon, Spivak, McClelland, Maier & Neustadt, L.L.P.

(57) ABSTRACT

An exemplary phase interpolator includes a first to a fourth differential pair. Each of the differential pairs includes a first and a second transistor and a stabilizing capacitor connected between a source coupled node and a reference voltage. The phase interpolator also includes a plurality of current sources and a group of switches to switch connections between the source coupled nodes of the differential pairs and the current sources so that (i) a first operating current is supplied to a first selected one of the first and second differential pairs and (ii) a second operating current is supplied to a second selected one of the third and fourth differential pairs. Drains of the first transistors in the differential pairs are commonly connected and drains of the second transistors in the differential pairs are commonly connected to form a first and a second output node so that a differential output signal is output.

29 Claims, 9 Drawing Sheets

PHASE INTERPOLATOR AND METHOD OF PHASE INTERPOLATION WITH REDUCED PHASE ERROR

This application claims benefit of Japanese Application No. JP-A-2012-030366. The disclosure of the prior application is hereby incorporated by reference in its entirety.

BACKGROUND

This disclosure relates to a phase interpolator that interpolates between phases of a plurality of differential input signals to produces a differential output signal having a desired phase.

FIG. 12 shows a circuit diagram of a conventional phase interpolator. The phase interpolator 32 shown in FIG. 12 receives input signals I, Q, Ib, and Qb, which are four-phase signals that are 90° out of phase from each other. That is, the phase interpolator 32 divides a full cycle of a reference clock signal into first to fourth quadrants with the input signals I, Ib, Q, and Qb, as shown in FIG. 13. The phase interpolator 32 interpolates between the phases of these input signals.

The phase interpolator 32 includes four differential pairs 12-1 to 12-4, sixteen current sources 14-1 to 14-16, a group of switches 16 composed of a plurality of switches, and two load resistors 18A and 18B. Each of the differential pairs 12-1 to 12-4 includes two NMOSs (N-channel metal-oxide semiconductor transistors) 20A and 20B.

The NMOSs 20A of the differential pairs 12-1 to 12-4 are commonly connected to form a negative output node N, which is connected to the power supply through a load resistor 18A. The NMOSs 20B of the differential pairs 12-1 to 12-4 are commonly connected to form a positive output node P, which is connected to the power supply through a load resistor 18B. The phase interpolator 32 outputs a differential output signal OUTP and OUTN having a desired phase from the positive and negative output nodes.

As shown in FIG. 14, the input signals I, Ib, Q, and Qb are four-phase signals having sine waveforms or near sine waveforms and they are assumed to have the same amplitude. The input signals have phases that are 90° out of phase from each other in the order of the input signals I, Q, Ib, and Qb. For example, the input signals I, Q, Ib, and Qb have phases of 0°, 90°, 180°, and 270°, respectively.

The group of switches 16 includes four quadrant switching switches 22-1 to 22-4 and sixteen pairs of phase switching switches 24-1N and 24-1P to 24-16N and 24-16P. A control code is supplied to the group of switches 16 to select one of the quadrants and to select the phase within the selected quadrant. That is, the control code includes a quadrant switching signal to control the quadrant switching switches 22-1 to 22-4, and a phase switching signal to control the phase switching switches 24-1N and 24-1P to 24-16N and 24-16P.

In the first quadrant, the quadrant switching switches 22-1 and 22-3 are turned on in accordance with the quadrant switching signal, and the differential pairs 12-1 and 12-3 are selected. The phase switching switches 24-1N and 24-1P to 24-16N and 24-16P are turned on or off in accordance with the phase switching signal, and the numbers of current sources connected to each of the differential pairs 12-1 and 12-3 are determined. Specifically, in each of the pairs of switches 24-$i$N and 24-$i$P, where i=1 to 16, one of the switches is turned on and the other is turned off in accordance with the phase switching signal.

For example, the phase switching signal may be set such that the phase switching switch 24-1N is turned on, the phase switching switch 24-1P is turned off, the phase switching switches 24-2N to 24-16N are turned off, and the phase switching switches 24-2P to 24-16P are turned on. In this case, one current source 14-1 becomes connected to the source coupled node S, or a connection node of sources of NMOS 20A and NMOS 20B, of the differential pair 12-1. Fifteen current sources 14-2 to 14-16 become connected to the source coupled node S of the differential pair 12-3.

On or off state of each of NMOSs 20A and 20B of the differential pair 12-1 varies in accordance with the differential input signal I and Ib. The current supplied from the current source 14-1 is divided and flows through the NMOSs 20A and 20B of the differential pair 12-1 with varying ratios in accordance with the on or off states of each of the NMOSs 20A and 20B. Similarly, on or off state of each of NMOSs 20A and 20B of the differential pair 12-3 varies in accordance with the differential input signal Q and Qb. A sum of currents supplied from the current sources 14-2 to 14-16 is divided and flows through the NMOSs 20A and 20B of the differential pair 12-3 with varying ratios in accordance with the on or off state of each of the NMOSs 20A and 20B.

The currents that flow through NMOSs 20A of the differential pairs 12-1 and 12-3 are combined and summed at the negative output node N. The currents that flow through NMOSs 20B of the differential pairs 12-1 and 12-3 are combined and summed at the positive output node P. The combined currents further flow through respective load resistors 18A and 18B and are converted to the differential output signal OUTN and OUTP.

That is, phase interpolator 32 combines the input signals I and Q with a ratio corresponding to the ratio between the currents supplied to the source coupled nodes of the differential pairs 12-1 and 12-3 to generate the differential output signal OUTP and OUTN. The control code, which controls the ratio of currents supplied to the differential pairs 12-1 and 12-3, controls the phase of the differential output signal.

Phase of the differential output signal OUTP and OUTN in the first quadrant can be switched with a predetermined interval, or a phase step, by switching the phase switching switches 24-1N and 24-1P to 24-16N and 24-16P in accordance with the control code. The same applies to the second to fourth quadrants. The differential output signal OUTP and OUTN having phases in the range of 0° to 90° for the first quadrant, in the range of 90° to 180° for the second quadrant, in the range of 180° to 270° for the third quadrant, and in the range of 270° to 360° for the fourth quadrant are generated.

As shown in FIG. 12, the phase interpolator 32 includes sixteen current sources 14-1 to 14-16 arranged in parallel. If each of the sixteen current sources 14-1 to 14-16 supplies the same current, the phase interpolator 32 can vary the phase of the differential output signal OUTP and OUTN in sixteen steps in each of the quadrants.

That is, the combination of four quadrant switching switches 22-1 to 22-4 and sixteen pairs of phase switching switches 24-1N and 24-1P to 24-16N and 24-16P enables to vary the phase of differential output signal OUTP and OUTN in 64 steps by using sixteen current sources. In this example, a shared use of the current sources in the first to fourth quadrants enables to decrease the number of current sources to 16, which is one-quarter of the number of steps.

Various references disclose phase interpolators with various other constructions. For example, Japanese Patent No. 3880302 (Patent Document 1) discloses a phase interpolator in witch one variable current source is provided for each of the differential pairs. In the phase interpolator disclosed in Patent Document 1, each of the variable current sources has a capacity of supplying the maximum current that the corresponding differential pair requires. That is, each of the variable current sources has a capacity of supplying the total current that the sixteen currents sources 14-1 to 14-16 in the phase interpolator 32 shown in FIG. 12 supply.

As a result, the phase interpolator disclosed in the Patent Document 1 requires four time larger total current supply capacity, and requires larger total area for providing current sources. Thus, the phase interpolator 32 shown in FIG. 12 is advantageous in that it requires less area for proving current sources.

However, the phase interpolator 32 shown in FIG. 12 utilizes the group of switches 16 including the quadrant switching switches 22-1 to 22-4 and the phase switching switches 24-1N and 24-1P to 24-16N and 24-16P to supply currents from the current sources 14-1 to 14-16 to the source coupled nodes of the differential pairs 12-1 to 12-4. Accordingly, a parasitic capacitance including those of the switches, the current sources, and wirings between the differential pairs and the current sources is connected to the source coupled nodes of the differential pairs selected by the quadrant switching switches.

The parasitic capacitance affects the phase of differential output signal OUTP and OUTN, which is supposed to be determined only by the ratio of currents supplied to the source coupled nodes of the differential pairs. As a result, the phase interpolator shown in FIG. 12 has a problem that the phase error is large.

The problem of the phase error could be solved if the current supplied from the current sources 14-1 to 14-16 were sufficiently larger than the current flowing through the parasitic capacitance. In actual, however, the current sources 14-1 to 14-16 are usually designed to have a minimal size in order to reduce the circuit area. Accordingly, the current supplied from the current sources 14-1 to 14-16 cannot always be sufficiently larger than the current flowing through the parasitic capacitance.

The parasitic capacitance connected to the source coupled node varies depending on connection patterns, or on or off states of the switches, of the group of switches 16. That is, the parasitic capacitance is a function of the control code and increases when the control code has a specific value. Furthermore, the phase error resulting from the parasitic capacitance varies widely depending on the input conditions of the differential input signals to the phase interpolator 32 or the PVT conditions, which includes fabrication process of the semiconductor integrated circuit that includes the phase interpolator, power supply voltage of the phase interpolator, and operating temperature of the phase interpolator. Thus, it is virtually impossible to cancel out the phase error by adjusting the sizes of transistors or other parameters.

SUMMARY

It would be advantageous to provide a phase interpolator and a method of phase interpolation capable of generating differential output signals having desired phases without being significantly influenced by parasitic capacitances connected to source coupled nodes of differential pairs.

Aspects of this disclosure provide a phase interpolator that includes a first, a second, a third, and a fourth differential pair each including a first and a second transistor having sources coupled with each other to form a source coupled node. Each of the differential pairs further includes a stabilizing capacitor connected between the source coupled node and a reference voltage. The phase interpolator also includes a plurality of current sources, and a group of switches having a plurality of connection patterns to switch connections between the source coupled nodes of the differential pairs and the plurality of current sources so that (i) a first operating current is supplied to the source coupled node of a first selected one of the first and second differential pairs and (ii) a second operating current is supplied to the source coupled node of a second selected one of the third and fourth differential pairs. Gates of the first and second transistors in the first differential pair receive a first input signal having a first phase and a second input signal having a second phase opposite to the first phase, respectively. Gates of the first and second transistors in the second differential pair receive the second input signal and the first input signal, respectively. Gates of the first and second transistors in the third differential pair receive a third input signal having a third phase between the first and second phases and a fourth input signal having a fourth phase opposite to the third phase, respectively. Gates of the first and second transistors in the fourth differential pair receive the fourth input signal and the third input signal, respectively. Drains of the first transistors in the differential pairs are commonly connected to a first load resistor to form a first output node and drains of the second transistors in the differential pairs are commonly connected to a second load resistor to form a second output node so that a differential output signal is output from the first and second output nodes.

In examples, a parasitic capacitance connected to the source coupled node of each of the differential pairs varies up to a maximum capacitance value depending on the connection patterns of the group of switches, and the stabilizing capacitor in each of the differential pairs may have a capacitance equal to or larger than the maximum capacitance value, or twice the maximum capacitance value, or five times the maximum capacitance value of the parasitic capacitance connected to the source coupled node of the same differential pair.

In other examples, the stabilizing capacitor of each of the differential pairs may have a capacitance that reduces an amplitude of voltage fluctuation at the source coupled node of the same differential pair to which the parasitic capacitance having the maximum capacitance value is connected to ½ or less, or ⅕ or less, or ¹⁄₁₀ or less compared with a case that the stabilizing capacitor is not connected.

In still other examples, the first and second operating current vary up to a first and a second maximum operating current, respectively, depending on the connection patterns of the group of switches, and the stabilizing capacitor of each of the differential pairs has a capacitance that reduces an amplitude of voltage fluctuation at the source coupled node of the same differential pair to which corresponding one of the first and second maximum operating current is supplied to ½ or less, or ⅕ or less, or ¹⁄₁₀ or less compared with the case that the stabilizing capacitor is not connected.

In an embodiment, the stabilizing capacitors in the first and second differential pairs may have a first same capacitance and the stabilizing capacitors in the third and fourth differential pairs may have a second same capacitance. In another embodiment, the group of switches may include first switches that select the first and second selected ones of the differential pairs and second switches that connect each of the plurality of current sources to supply one of the first and second operating currents.

In still other examples, the first and second operating current vary up to a first and a second maximum operating current, respectively, depending on the connection patterns of the group of switches, and the stabilizing capacitor of each of the differential pairs has a capacitance that reduces an amplitude of voltage fluctuation at the source coupled node of the same differential pair to which corresponding one of the first and second maximum operating current is supplied to ½ or less, or ⅕ or less, or ¹⁄₁₀ or less compared with the case that the stabilizing capacitor is not connected.

Aspects of this disclosure provide a method of phase interpolation that includes providing a first, a second, a third, and a fourth differential pair each including a first and a second transistor having sources coupled with each other to form a source coupled node. The method also includes providing a plurality of current sources, and supplying a first operating current to the source coupled node of a first selected one of the first and second differential pairs and a second operating current to the source coupled node of a second selected one of the third and fourth differential pairs by switching connection between the source coupled nodes of the differential pairs and the plurality of current sources. The method further includes inputting a first input signal having a first phase and a second input signal having a second phase opposite to the first phase to gates of the first and second transistors, respectively, in the first differential pair, inputting the second input signal and the first input signal to gates of the first and second transistors, respectively, in the second differential pair, inputting a third input signal having a third phase between the first and second phases and a fourth input signal having a fourth phase opposite to the third phase to gates of the first and second transistors, respectively, in the third differential pair, and inputting the fourth input signal and the third input signal to gates of the first and second transistors, respectively, in the fourth differential pair. The method still further includes outputting a differential output signal from a first and a second output node, which are formed by commonly connecting drains of the first transistors in the differential pairs to a first load resistor and by commonly connecting drains of the second transistors in the differential pairs to a second load resistor, respectively, and reducing an amplitude of voltage fluctuation at the source coupled node of each of the differential pairs by connecting a stabilizing capacitors between the source coupled nodes of each of the differential pairs and a reference voltage.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION OF EMBODIMENTS

Exemplary phase interpolators according to this disclosure will be explained with reference to preferred embodiments shown in accompanying drawings.

Figure 1:
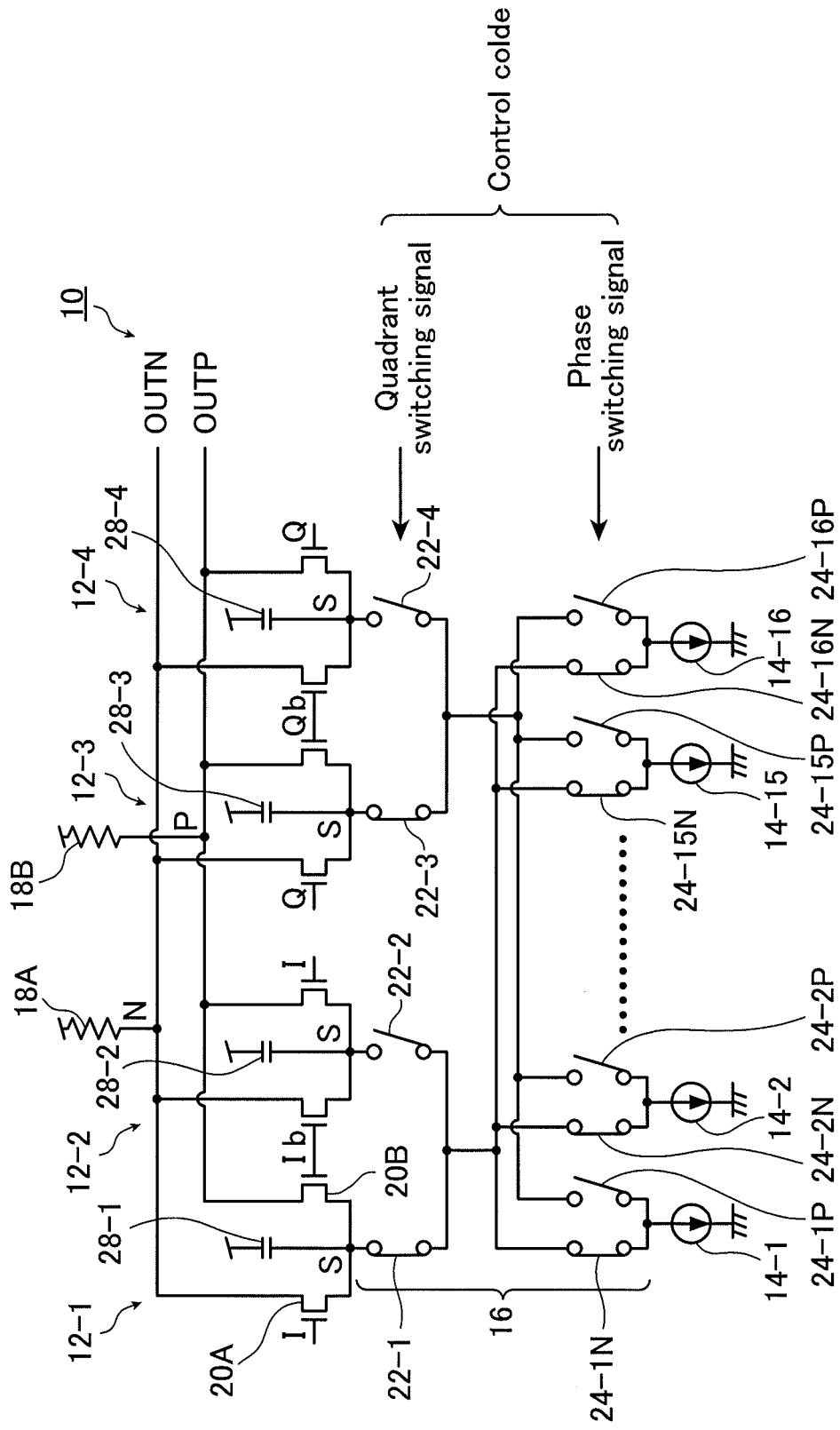
FIG. 1 shows a circuit diagram of an exemplary phase interpolator according to this disclosure.

FIG. 1 show a circuit diagram of an exemplary phase interpolator according to this disclosure. The exemplary phase interpolator 10 shown in FIG. 1 has basically the same construction as the conventional phase interpolator 32 shown in FIG. 12, but further includes stabilizing capacitors. That is, the phase interpolator 10 includes four differential pairs 12-1 to 12-4, sixteen current sources 14-1 to 14-16, a group of switches 16, two load resistors 18A and 18B, and further includes four stabilizing capacitors 28-1 to 28-4. The basic operation of the exemplary phase interpolator 10 is the same as that of the phase interpolator 32.

The differential pair 12-1 includes NMOSs 20A and 20B with their sources coupled to each other to form a source coupled node S. A differential input signal I and Ib is input into gates of the NMOS 20A and 20B, respectively.

Each of the differential pairs 12-2 to 12-4 has the same configuration as that of the differential pair 12-1, except that different differential input signals are input into gates of NMOSs 20A and 20B. That is, differential input signal Ib and I is input into gates of NMOS 20A and 20B, respectively, of the differential pair 12-2. Differential input signal Q and Qb is input into gates of NMOS 20A and 20B, respectively, of the differential pair 12-3. Differential input signal Qb and Q is input into gates of NMOS 20A and 20B, respectively, of the differential pair 12-4.

Figure 12:
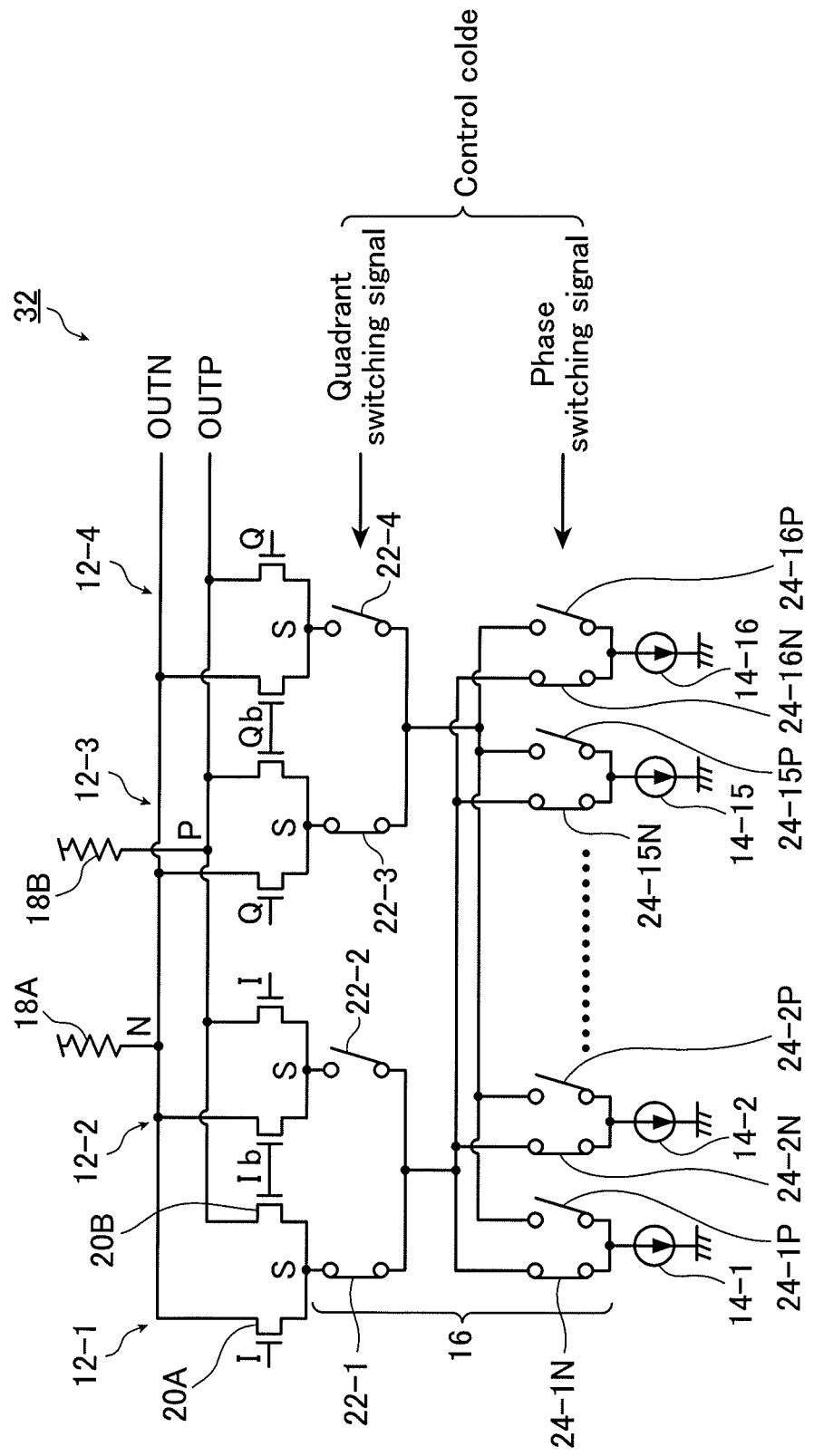
FIG. 12 shows a circuit diagram of a conventional phase interpolator.
Figure 13:
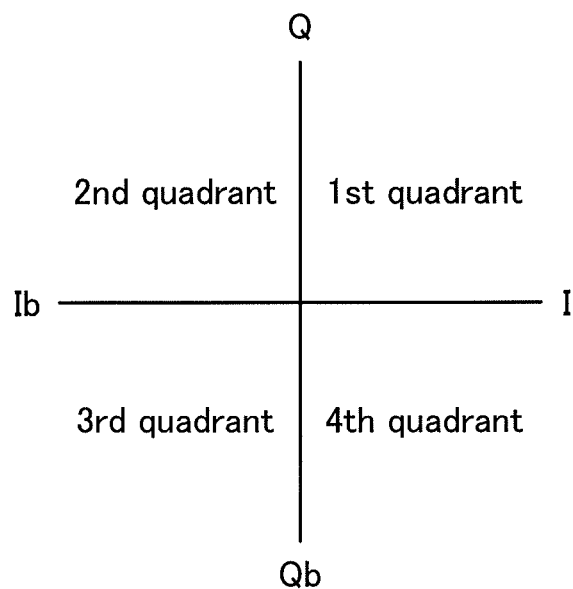
FIG. 13 shows first to fourth quadrants in which a full cycle of a reference clock signal is divided by input signals I, Ib, Q, and Qb.
Figure 14:
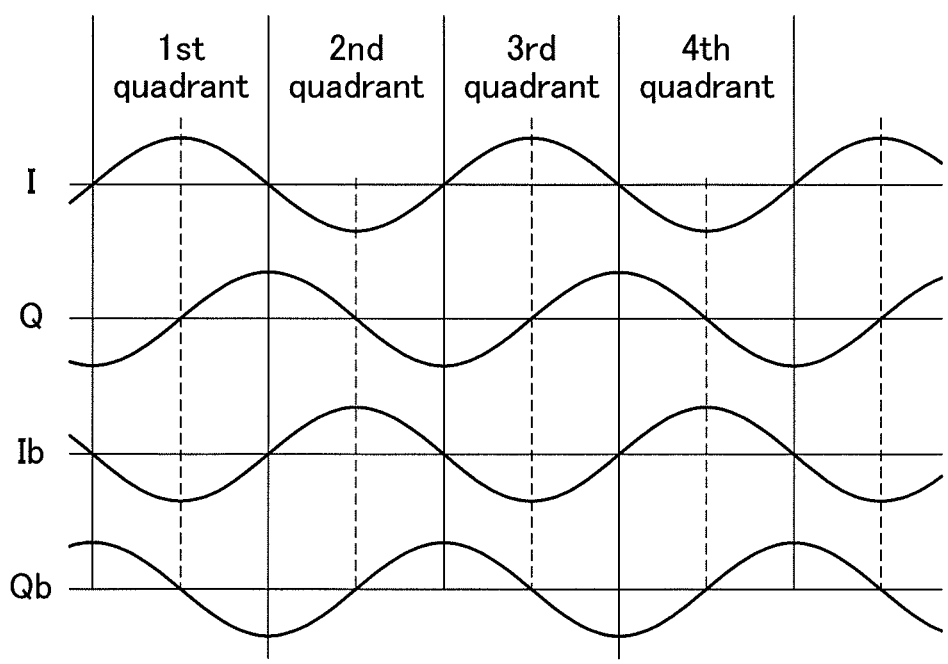
FIG. 14 shows waveforms of input signals I, Ib, Q, and Qb.

The input signals I, Ib, Q, and Qb are the same as those used in the conventional phase interpolator 32 shown in FIG. 12. The input signals I, Ib, Q, and Qb are four-phase signals having sine waveforms or near sine waveforms 90° out of phase from each other in the order of the input signals I, Q, Ib, and Qb, and they have an equal amplitude. Accordingly, the pair of input signals I and Ib can be input as a differential input signal because they have opposite phases and the same amplitude. Similarly, the pair of input signals Q and Qb can be input as a differential input signal because they have opposite phases and the same amplitude.

Each of the differential pairs 12-1 to 12-4 divides the operating current supplied to the source coupled node in accordance with the differential input signal input into gates of the NMOSs 20A and 20B. Pair of NMOSs 20A and 20B in each of the differential pairs may have the same dimension. Accordingly, NMOSs 20A and 20B equally divide the operating current when a differential voltage of the differential input signal I and Ib or the differential input signal Q and Qb is zero.

The amplitude of the differential input signal I and Ib or Q and Qb may preferably sufficiently large so that almost all of the operation current flows in one of the pair of NMOSs 20A and 20B when the differential voltage of the differential input signal reaches to the maximum value. It is also preferable, however, to limit the amplitude of the differential input signal so that the differential output signal keeps a near sine waveform. Furthermore, all of the NMOSs 20A and 20B in the differential pairs 12-1 to 12-4 may have the same dimension that is sufficient to flow the maximum current that may be supplied from the current sources 14-1 to 14-16, i.e., a sum of the currents supplied by all of the current sources 14-1 to 14-16.

The group of switches 16 are turned on or off in accordance with the control code and operate so as to switch connections between the source coupled nodes of the differential pairs 12-1 to 12-4 and the current sources 14-1 to 14-16. The control code is also the same as that used in the conventional phase interpolator 32 shown in FIG. 12 and contains a quadrant switching signal and a phase switching signal.

The group of switches 16 include four quadrant switching switches (first switches) 22-1 to 22-4 and sixteen pairs of phase switching switches (second switches) 24-1N and 24-1P to 24-16N to 24-16P. The quadrant switching switches 22-1 to 22-4 are turned on or off by a quadrant switching signal for switching a quadrant that contains the phase of differential output signal OUTP and OUTN. The phase switching switches 24-1N and 24-1P to 24-16N and 24-16P are turned on or off for switching the phase of differential output signal OUTP and OUTN in each quadrant.

One of the terminals of the quadrant switching switches 22-1 and 22-2 are connected to the source coupled nodes S of the differential pairs 12-1 and 12-2, respectively. The other terminals of the quadrant switching switches 22-1 and 22-2 are commonly connected to one of the terminals of the phase switching switches 24-1N to 24-16N. One of the terminals of the quadrant switching switches 22-3 and 22-4 are connected to the source coupled nodes S of the differential pairs 12-3 and 12-4, respectively. The other terminals of the quadrant switching switches 22-3 and 22-4 are commonly connected to one of the terminals of the phase switching switches 24-1P to 24-16P. The other terminals of each of the pairs of phase switching switches 24-1N and 24-1P to 24-16N and 24-16N are commonly connected to corresponding one of the current sources 14-1 to 14-16.

The quadrant switching switches 22-1 to 22-4 are turned on or off in accordance with the quadrant switching signal, which has four values corresponding to the first to fourth quadrants, to select one of the quadrants. In order to select the first quadrant, for example, two of the quadrant switching switches 22-1 and 22-3 are turned on to select the differential pairs 12-1 and 12-3 and the other quadrant switching switches 22-2 and 22-4 are turned off.

The phase switching switches 24-1N and 24-1P to 24-16N and 24-16P are turned on or off in accordance with the phase switching signal, which has sixteen values, to set the number of current sources connected to source coupled nodes of the selected ones of the differential pairs. In the first quadrant, for example, the phase switching switches set the number of current sources connected to the differential pair 12-1 from 16 to 1 and further set the number of current sources connected to the differential pair 12-3 from 0 to 15, respectively. Thereby, the phase switching switches 24-1N and 24-1P to 24-16N and 24-16P sets amounts of currents supplied to the selected ones of the differential pairs.

In the exemplary embodiment shown in FIG. 1, because the differential pairs 12-1 to 12-4 are constructed with NMOSs 20A and 20B, the current supplied to the source coupled nodes S flow toward the ground. That is, the current sources actually draw the current from the source coupled nodes toward the ground.

Drains of the NMOSs 20A in the differential pairs 12-1 to 12-4 are commonly connected to form a negative output node N so that the currents flowing through the NMOSs 20A in the differential pairs 12-1 to 12w-4 are combined or summed at the negative output node N. Drains of the NMOSs 20B in the differential pairs 12-1 to 12-4 are commonly connected to form a positive output node P so that the currents flowing through the NMOSs 20B in the differential pairs 12-1 to 12w-4 are combined or summed at the positive output node N.

The positive and negative output nodes P and N are connected to the power supply through respective load resistors 18B and 18A. The load resistors 18B and 18B convert the combined currents into voltages to generate a differential output signal OUTP and OUTN. In the exemplary phase interpolator shown in FIG. 1, the load resistors 18A and 18B have the same value.

Thus, the phase interpolator 10 generates a differential output signal OUTP and OUTN having a phase controlled by the control code. That is, the quadrant switching signal of the control code selects one of the differential pairs 12-1 and 12-2 and further selects one of the differential pairs 12-3 and 12-4, and the phase switching signal of the control code sets amounts of currents supplied to the selected ones of the differential pairs. The supplied currents are combined and a differential output signal OUTP and OUTN having a phase in accordance with the quadrant switching signal and the phase switching signal is generated.

In the exemplary phase interpolator 10 shown in FIG. 1, the quadrant switching signal has four values and the phase switching signal has sixteen values. Accordingly, the control code has 16×4=64 values, in total, and the group of switches 16 has 64 corresponding connection patterns. Thereby, the exemplary phase interpolator 10 shown in FIG. 1 can set the phase of differential output signal in 64 steps.

Finally, the stabilizing capacitors 28-1 to 28-4 are connected between the power supply voltage and the source coupled nodes of the differential pairs 12-1 to 12-4, respectively. The stabilizing capacitors stabilize the source coupled nodes S of the differential pairs 12-1 to 12-4. That is, the stabilizing capacitors suppress fluctuations of voltages at the source coupled nodes S.

Before explaining effect of the stabilizing capacitors, influence of the parasitic capacitance will be described with reference to FIGS. 2 through 6.

Figure 2:
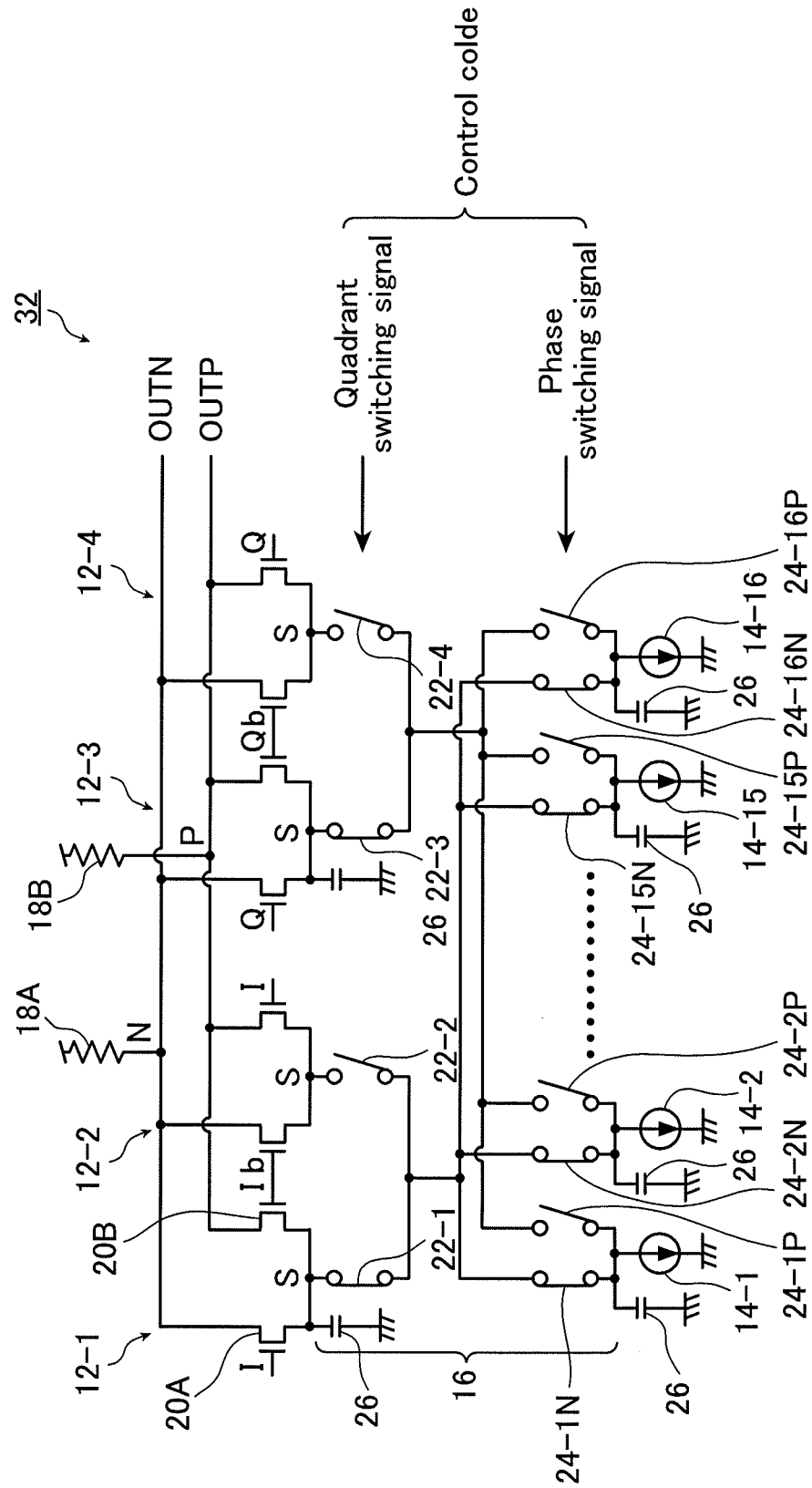
FIG. 2 shows a circuit diagram of the conventional phase interpolator shown in FIG. 12 where parasitic capacitances existing in the paths between source coupled nodes of differential pairs and current sources are shown.

FIG. 2 shows a circuit of the conventional phase interpolator 32 shown in FIG. 12 where parasitic capacitances are shown. That is, parasitic capacitances 26, which exist in the paths between the source coupled nodes of the differential pairs 12-1 to 12-4 and the current sources 14-1 to 14-16, are connected between the source coupled nodes and the ground.

Figure 3:
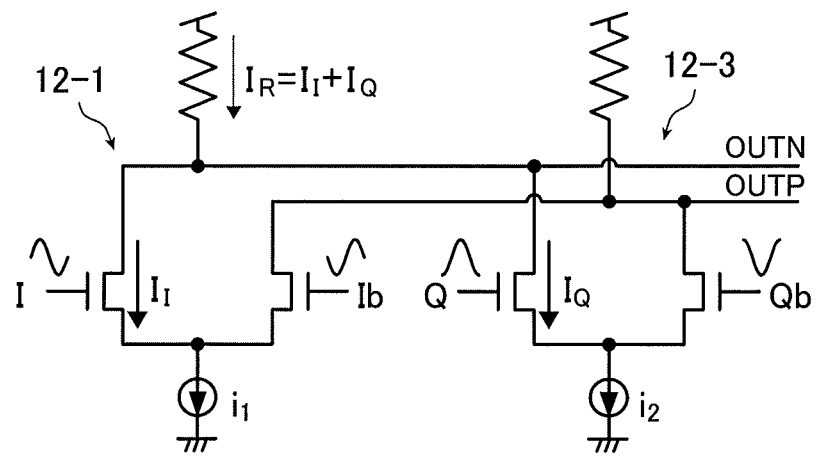
FIG. 3 shows conceptual phase interpolator that includes only selected differential pairs.

In the phase interpolation in the first quadrant between the input signals I and Q, the quadrant switching switches 22-1 and 22-3 are turned on in accordance with the quadrant switching signal and the differential pairs 12-1 and 12-3 are selected. FIG. 3 shows a conceptual phase interpolator that includes only the selected differential pairs 12-1 and 12-3.

Figure 4:
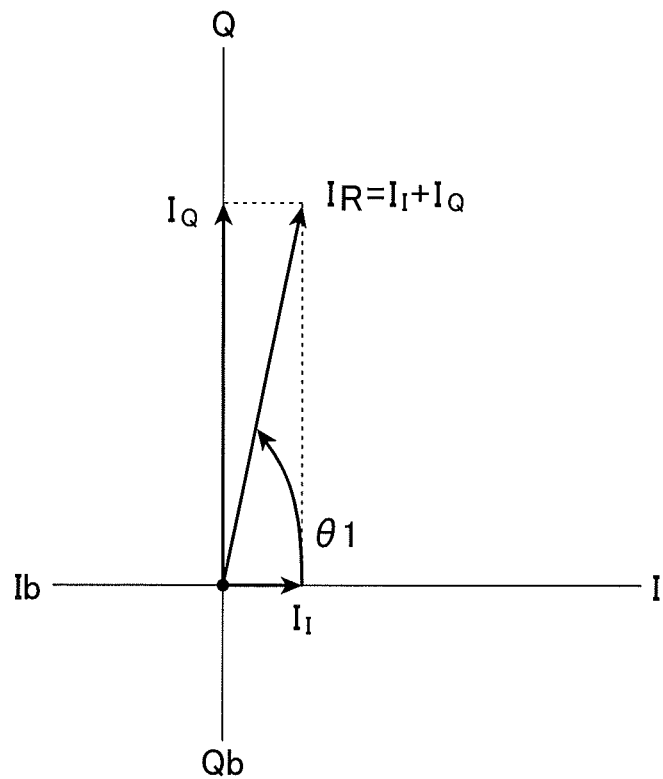
FIG. 4 shows a vector sum of currents $I_I$ and $I_Q$ in an ideal case in which no parasitic capacitance exists.

In the ideal I-Q interpolation, the current $I_R$ that flows through the load resistor 18A is represented by the vector sum of the current $I_I$ that flows through the NMOS 20A of the differential pair 12-1 and the current $I_Q$ that flows through NMOS 20A of the differential pair 12-3. That is, $I_R=I_I+I_Q$, as shown in FIG. 4. In FIG. 4, the horizontal axis is the I-Ib axis, and the vertical axis is the Q-Qb axis. The phase of the differential output signal OUTP and OUTN is θ1. In this case, the phase θ1 of the differential output signal OUTP and OUTN is determined by the ratio between the current $i_1$ supplied to the source coupled node of the differential pair 12-1 and the current $i_2$ supplied to the source coupled node of the differential pair 12-3.

Figure 5:
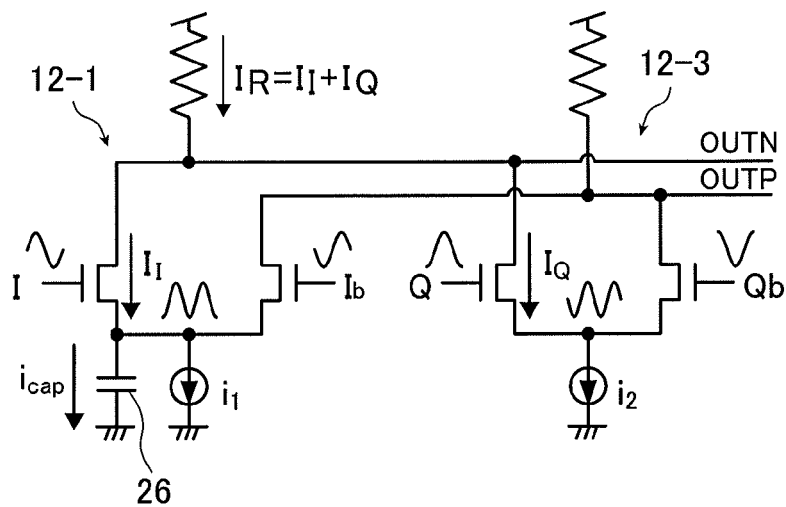
FIG. 5 shows the conceptual phase interpolator shown in FIG. 3 where a parasitic capacitance exists.

Next, FIG. 5 show the case that a parasitic capacitance 26, which exists in the path between the source coupled node of the differential pair 12-1 and the current sources, is connected between the source coupled node and the ground. Although parasitic capacitances may also be connected to source coupled nodes of other differential pairs as shown in FIG. 2, FIG. 5 shows the simplest case.

Figure 6:
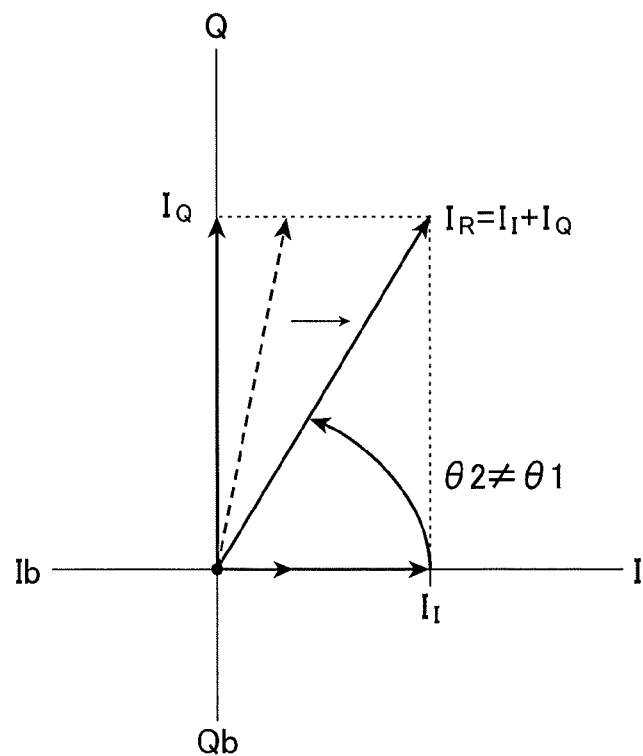
FIG. 6 shows a vector sum of currents $I_I$ and $I_Q$ when a parasitic capacitance exists.

In this case, a fluctuation of voltage at the source coupled node of the differential pair 12-1 causes a current $i_{cap}$ flowing through the parasitic capacitance 26 to charge or discharge the parasitic capacitance. A sum of the current $i_{cap}$ and the current $i_1$ supplied from the current source flows through the differential pair 12-1. Thus, as shown in FIG. 6, the current $I_R$ that actually flows through the load resistor 18A is represented as $I_R=(I_I+i_{cap})+I_Q$. Accordingly, the phase of the differential output signal OUTN changes to θ2, where θ1<θ2.

Note that the voltage of the source coupled node fluctuates even when the parasitic capacitance 26 is not connected. That is, when the differential voltage of the differential input signal I and Ib is zero, both of the NMOSs 20A and 20B are turned on and the voltage of the source coupled node becomes Vcommon−Vth. Here, Vcommon is the common mode voltage of the differential input signal I and Ib, and Vth is the threshold voltage of the NMOSs 20A and 20B. On the other hand, when the differential voltage of the differential input signal I and Ib reaches to the maximum value, i.e., when a voltage of the input signal I is Vmax and a voltage of the input signal Ib is Vmin, for example, only the NMOS 20A is turned on and the voltage of the source coupled node becomes Vmax−Vth, which is higher than Vcommon−Vth. Accordingly, the voltage of the source coupled node fluctuates with a frequency of twice the frequency of the differential input signal I and Ib.

As described above, when the parasitic capacitance 26 is connected to the source coupled node of the differential pair, a current $i_{cap}$ flows through the parasitic capacitance 26. As a result, phase of the differential output signal OUTP and OUTN contains a phase error from the ideal phase expected by the control code.

In order to address this problem, the exemplary phase interpolator shown in FIG. 1 connects stabilizing capacitors 28-1 to 28-4 to the source coupled nodes of the differential pairs 12-1 to 12-4, respectively. The stabilizing capacitors 28-1 to 28-4 suppress the voltage fluctuations at the source coupled nodes and reduce the currents flowing through the parasitic capacitances 26. As a result, the phase error can be reduced and the exemplary phase interpolator shown in FIG. 1 can accurately control the phase of differential output signal OUTP and OUTN with the control code.

In order to effectively reduce the current flowing through the parasitic capacitance and to reduce the phase error, the stabilizing capacitor needs to have a sufficiently large capacitance. Accordingly, the capacitance value of each of the stabilizing capacitors 28-1 to 28-4 is equal to or larger than the value of the parasitic capacitance 26 that exists in the path between the source coupled node of corresponding one of the differential pairs and the current sources. The capacitance value of each of the stabilizing capacitors may preferably be twice or more, or more preferably be five times or more, of the value of the parasitic capacitance that exits and connected to the source coupled node of the corresponding one of the differential pairs.

Here, the value of the parasitic capacitance changes depending on the connection pattern of the group of switches controlled by the control code. Accordingly, the capacitance value of the stabilizing capacitor may be equal to or larger than the maximum value, or preferably be twice or more, or further preferably be five times or more, of the maximum value of the parasitic capacitance that may exist in the path and connected to the source coupled node.

Usually, the parasitic capacitance connected to a source coupled node increases to the maximum value when the operating current supplied to that source coupled node increases to the maximum value. In the exemplary phase interpolator 10 shown in FIG. 1, the parasitic capacitance connected to a source coupled node increases to the maximum value when the operating current supplied to that source coupled node increases to the maximum value by connecting all of the current sources to that source coupled node.

Furthermore, it may be preferable that the stabilizing capacitor has a capacitance value that can reduce amplitude of voltage fluctuation at the source coupled node to ½ or less compared with the amplitude when the stabilizing capacitor is not connected. Here, a higher capacitance value of the stabilizing capacitor is required to reduce the voltage fluctuation when a larger parasitic capacitance is connected to the source coupled node.

Accordingly, it may be preferable that the stabilizing capacitor has a capacitance value that can reduce the amplitude of voltage fluctuation of the source coupled node to ½ or less compared with the case that the stabilizing capacitor is not connected even if the parasitic capacitance increases to the maximum value. That is, if the parasitic capacitance increases to the maximum value when the operating current supplied to the source coupled node increases to the maximum value, it may be preferable that the stabilizing capacitor has a capacitance value that can reduce the amplitude of voltage fluctuation of the source coupled node to which the maximum operating current is supplied connected to ½ or less compared with the case that the stabilizing capacitor is not connected.

It may be more preferable that the stabilizing capacitor has a capacitance value that reduce the amplitude of voltage fluctuation of the source coupled node to which the parasitic capacitance having the maximum value is connected to ⅕ or less, or further to 1/10 or less compared with the case that the stabilizing capacitor is not connected.

The differential pairs may also be constructed with PMOSs (p-channel MOS transistors). In this case, connections to the power supply and to the ground are interchanged. The division into the first to fourth quadrants and the shared use of current sources by all of the quadrants are optional. It is possible to divide the full cycle of the reference clock signal into any number of regions. The stabilizing capacitor is also effective to reduce the influence of parasitic capacitance in phase interpolators that share the current sources by only some of the quadrants, or regions. The stabilizing capacitor is effective even in phase interpolators that provide separate current sources for each of the quadrants, or regions.

Number of the current sources and amounts of currents of respective current sources may be changed as appropriate. Providing a group of switches capable for connecting all the current sources to each of the differential pairs is also optional. Current sources connectable only to specific one or ones of differential pairs may be included. Providing a group of switches including the quadrant switching switches and the phase switching switches is optional. The number of switches and connections between the switches may be changed as appropriate.

When a group of switches that switch connections between the source coupled nodes of differential pairs and current sources is provided to switch the region in the cycle and the phase within the region, parasitic capacitances connected to the source coupled nodes vary depending on the connection pattern of the group of switches. Accordingly, the stabilizing capacitor is effective to reduce the influence of parasitic capacitance regardless of the specific construction of the group of switches.

The stabilizing capacitors 28-1 to 28-4 shown in FIG. 1 are connected between the ground and the source coupled nodes of the differential pairs 12-1 to 12-4, respectively. It is also possible to connect the stabilizing capacitors between the ground, or other reference voltages, and the source coupled nodes.

Figure 7:
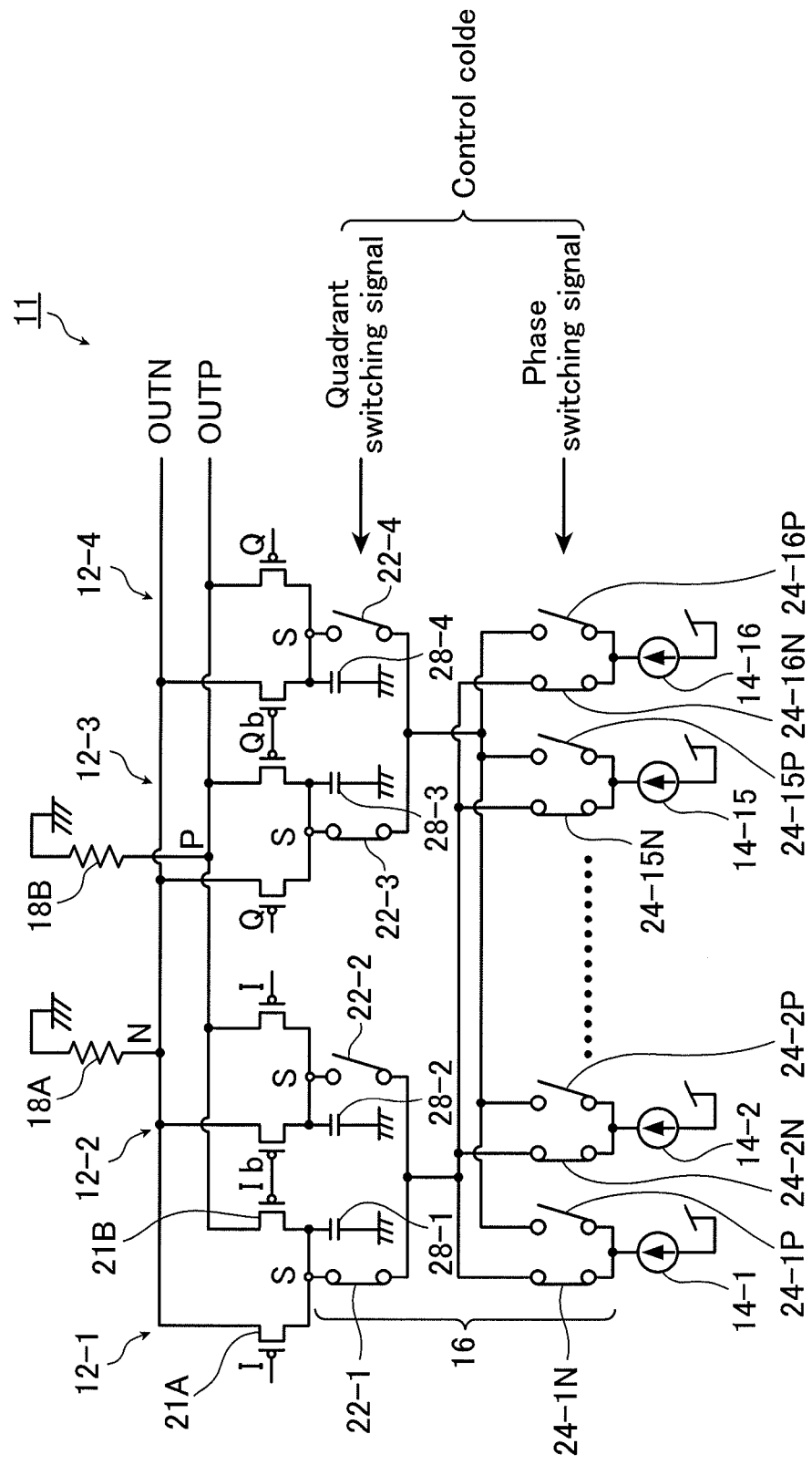
FIG. 7 shows a circuit diagram of another exemplary phase interpolator according to this disclosure.

FIG. 7 shows a circuit diagram of another exemplary phase interpolator 11 where each of differential pairs 12-1 to 12-4 includes PMOSs 21A and 21B. In the exemplary phase interpolator shown in FIG. 7, stabilizing capacitors 28-1 to 28-4 are connected between the ground and the source coupled nodes S of the differential pairs 12-1 to 12-4, respectively. The current sources 14-1 to 14-16 draw respective currents from the power supply. The load resistors 18A and 18B are connected between the ground and the output nodes N and P, respectively.

Next, characteristics of the exemplary phase interpolator 10 according to this disclosure and those of the conventional phase interpolator 32 are compared.

Figure 8:
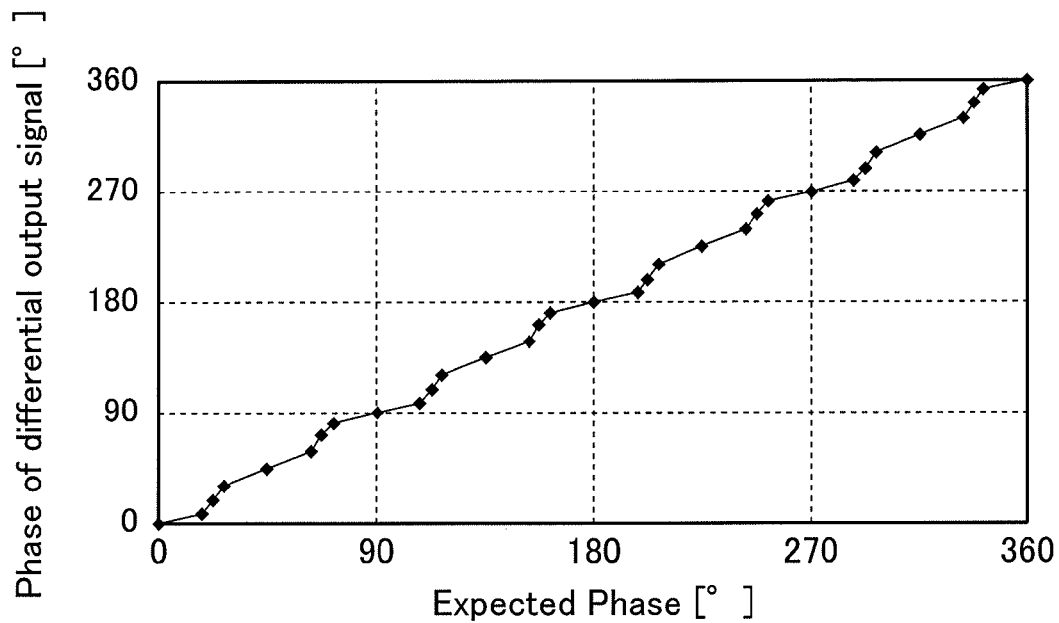
FIG. 8 shows a relationship between the phase of differential output signal and the phase expected by the control code in the conventional phase interpolator shown in FIG. 12.

FIG. 8 shows a relationship between the phase of differential output signal and the phase expected by the control code of the conventional phase interpolator 32 shown in FIG. 12. In FIG. 8, the vertical axis indicates the phase of actual differential output signal OUTP and OUTN [°], and the horizontal axis indicates the phase of differential output signal expected by the control code [°]. Each of the closed squares in FIG. 8 corresponds to each of the values of the control code. Because the phase of differential output signal OUTP and OUTN in the conventional phase interpolator 32 is affected by the parasitic capacitances 26, there are large errors between the expected phase and the actual phase, as shown in this graph.

Figure 9:
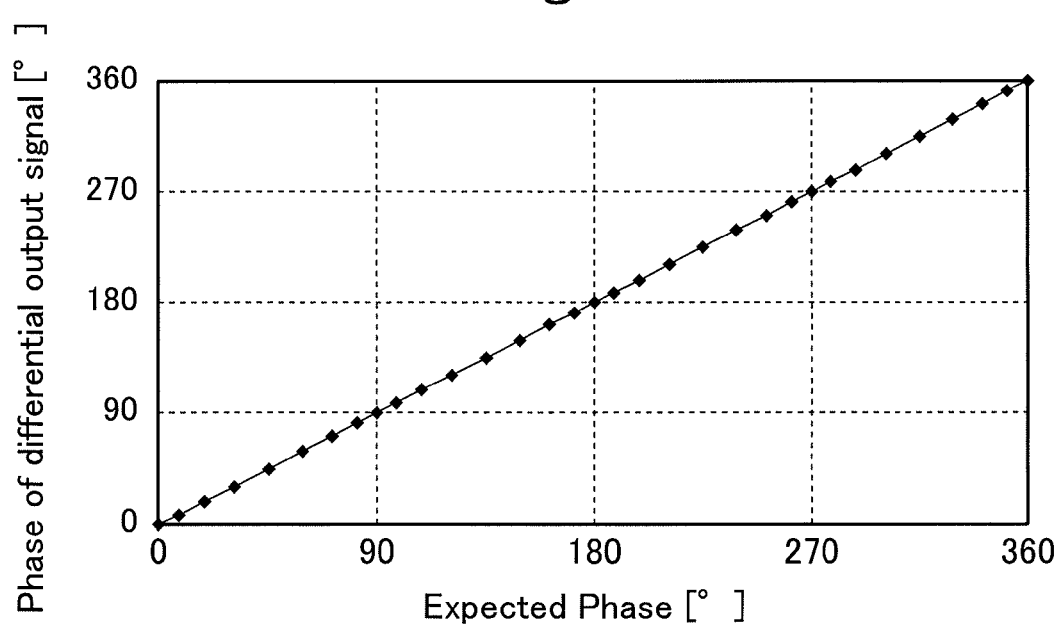
FIG. 9 shows a relationship between the phase of differential output signal and the phase expected by the control code in the exemplary phase interpolator shown in FIG. 1.

In contrast, FIG. 9 shows a relationship between the phase of differential output signal and the phase expected by the control code of the exemplary phase interpolator 10 according to this disclosure. The exemplary phase interpolator 10 includes the stabilizing capacitors 28-1 to 28-4 connected to the source coupled nodes of the differential pairs 12-1 to 12-4, respectively. Accordingly, the exemplary phase interpolator can suppress the influence of parasitic capacitances 26 on the phase of differential output signal OUTP and OUTN.

As shown in this graph, the expected phase and the actual phase of the differential output signal are substantially the same. That is, the exemplary phase interpolator effectively suppresses the influence of parasitic capacitors to a degree that the influence is negligible.

It is noted that, although the stabilizing capacitor suppress the voltage fluctuation at the source coupled node and reduces the current flowing through the parasitic capacitance, the stabilizing capacitor generates a current that flows through the stabilizing capacitor itself. Specifically, although the voltage fluctuation at the source coupled node is suppressed, a large current may flow to charge and discharge the stabilizing capacitor because the stabilizing capacitor has a larger capacitance value than that of the parasitic capacitance. Thus, it is not self-evident that the stabilizing capacitor decreases the phase error.

In fact, the exemplary phase interpolator 10 has a construction that can cancel the influences of the currents flowing in the stabilizing capacitors. That is, the exemplary phase interpolator 10 has a pair of differential pairs 12-1 and 12-2 that receive the same differential input signal I and Ib. Accordingly, assuming that (i) the stabilizing capacitors 28-1 and 28-2 connected to respective source coupled nodes of the differential pairs 12-1 and 12-2 have the same capacitance and that (ii) the capacitances of the stabilizing capacitors 28-1 and 28-2 connected to the source coupled nodes of the differential pairs 12-1 and 12-2 are larger than the parasitic capacitances connected to respective source coupled nodes, the source coupled nodes of the differential pairs 12-1 and 12-2 fluctuate with the same amplitude and the same phase. As a result, the voltage fluctuations at the source coupled nodes of the differential pairs 12-1 and 12-2 generate currents flowing through the stabilizing capacitors 28-1 and 28-2 having the same amplitude and the same phase.

However, the differential pairs 12-1 and 12-2 receive the differential input signal I and Ib with opposite phases. That is, the input signals I and Ib are input to NMOSs 20A and 20B, respectively, of the differential pair 12-1, while the same input signals input to NMOSs 20B and 20A, respectively, of the differential pair 12-2. Accordingly, the currents flowing through the stabilizing capacitors 28-1 and 28-2 flow through NMOSs 20A and 20B of the differential pairs 12-1 and 12-2 with opposite phases. That is, for example, the current flows through NMOS 20A of the differential pair 12-1 when the voltage of I signal is higher than that of Ib signal, while the current flows through NMOS 20A of the differential pair 12-2 when the voltage of Ib signal is higher than that of I signal.

In other words, the currents flowing through the stabilizing capacitors 28-1 and 28-2 flow through opposite one of the NMOSs 20A and 20B of the differential pairs 12-1 and 12-2 with the same phase. That is, the currents flow through NMOS 20A of the differential pair 12-1 and through NMOS 20B of the differential pair 12-2 when the voltage of I signal is higher than that of Ib signal, while the currents flow through NMOS 20B of the differential pair 12-1 and through NMOS 20A of the differential pair 12-2 when the voltage of Ib signal is higher than that of I signal.

Accordingly, the currents flowing through the stabilizing capacitors 28-1 and 28-2 flow through the load resistors 18A and 18B with the same amplitude and the same phase and generate no differential output signal. The same applies to the second pair of differential pairs 12-3 and 12-4, which receive the differential input signal Q and Qb with opposite phases. As a result, the currents flowing through the stabilizing capacitors 28-1 to 28-4 do not influence the phase of differential output signal.

As explained above, the exemplary phase interpolator 10 shown in FIG. 1 has a construction that (i) pairs of differential pairs that receive the same differential input signals with opposite phases, i.e., a pair of differential pairs 12-1 and 12-2 that receive the differential input signal I and Ib and a pair of differential pairs 12-3 and 12-4 that receive the differential input signal Q and Qb, are provided and (ii) outputs a differential output signal from positive and negative output nodes P and N that are formed by commonly connecting drains of transistors in the differential pairs. The exemplary phase interpolator having this construction can cancel the influences of currents flowing in the stabilizing capacitors and can effectively reduce the influence of parasitic capacitance.

The analysis indicates that it is preferable to connect stabilizing capacitors having the same capacitance to source coupled nodes of the differential pairs that receive the same differential input signal. In the exemplary phase interpolator shown in FIG. 1, it is preferable that the stabilizing capacitors 28-1 and 28-2 connected to the source coupled nodes of the differential pairs 12-1 and 12-2 have the same capacitance. It is also preferable that the stabilizing capacitors 28-3 and 28-4 connected to the source coupled nodes of the differential pairs 12-3 and 12-4 have the same capacitance.

However, the stabilizing capacitors provided in the exemplary phase interpolator having the construction described above can reduce the influence of parasitic capacitances even in the case that the capacitances of the stabilizing capacitors connected to source coupled nodes of the differential pairs that receive the same differential input signal are not the same. The phase error can be evaluated by using, for example, a circuit simulation and capacitances of the stabilizing capacitors can be determined such that the amount of error is suppressed within an acceptable range.

It is not necessary that stabilizing capacitors connected to source coupled nodes of differential pairs that receive different differential input signals have the same capacitance. That is, stabilizing capacitors 28-1 and 28-2 connected to the source coupled nodes of the differential pairs 12-1 and 12-2 may have different capacitance that that of stabilizing capacitors 28-3 and 28-4 connected to the source coupled nodes of the differential pairs 12-3 and 12-4.

Next, a method of improving linearity between the phase of differential output signal and the value of control code is described.

The exemplary phase interpolator 10 ensures that the expected phase and the actual phase are the same as shown in FIG. 9. However, intervals between the closes squares, which represent steps between phases of differential output signals corresponding to successive values of the control code, vary. This means that a range of the phase from 0° to 360° is not divided uniformly by the values of control code. In other words, a linearly between the phases of differential output signal and the values of control code is not good.

Note that the exemplary phase interpolator having the characteristic shown in FIG. 9 can be advantageously used in various applications because of the reduced phase error. However, the linearity is desirable in some other application. Accordingly, a further modification of the exemplary phase interpolator to improve the linearly is made.

Figure 10:
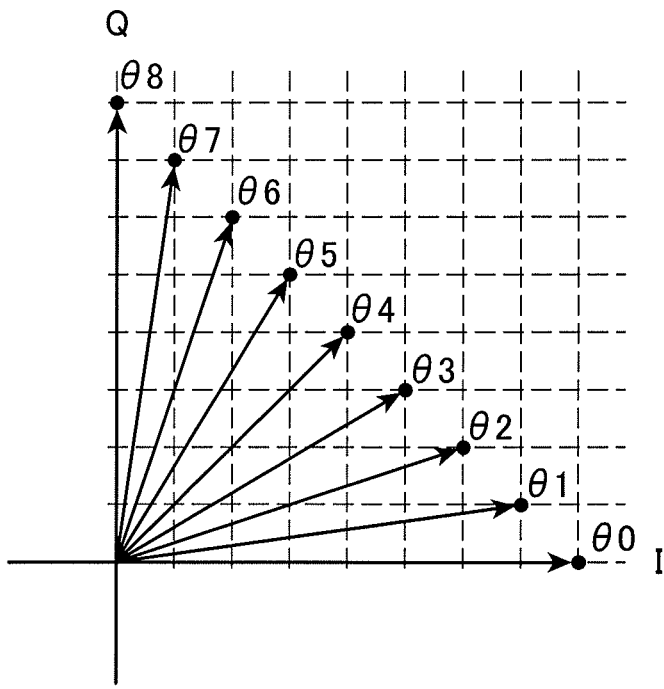
FIG. 10 shows a conceptual diagram that shows how the phase of differential output signal varies in the first quadrant.

FIG. 10 shows a conceptual diagram that shows how the phase of differential output signal varies in the first quadrant. FIG. 10 shows an example in which the lengths of I and Q vectors vary in nine steps of 0 to 8. When the length of I vector is eight and the length of Q vector is zero, i.e., when all of the current sources supply the operating current to the differential pair 12-1 and no current source supply the operating current to the differential pair 12-3, the phase of differential output signal is θ0=0°. When the length of I vector is zero and the length of Q vector is eight, the phase of differential output signal is θ8=90°. When the length of I vector changes from seven to one and the length of Q vector changes from one to seven, the phase of differential output signal changes from θ1 to θ7.

Phases of the differential output signal θ1 to θ7 can be calculated from $\tan^{-1}(Q/I)$. The phase θ1 is $\tan^{-1}(1/7) \approx 8.1°$. Similarly, phases θ2 to θ7 are approximately equal to 18.4°, 31.0°, 45.0°, 59.0°, 71.6°, and 81.9°, respectively.

Comparison between these phases reveals that θ1−θ0<θ2−θ1. Similarly, θ2−θ1<θ3−θ2, and θ3−θ2<θ−θ3. In contrast, θ5−θ4>θ6−θ5, θ6−θ5>θ7−θ6, and θ7−θ6>θ8−θ7. In this way, when all of the current sources 14-1 to 14-16 supply the same current, the phase steps are not uniform, as shown in FIG. 9.

To make the phase steps uniform, lengths of I and Q vectors in each of the steps are determined using a trigonometric function, or arc tangent, given by Expression (1), and currents of the current sources 14-1 to 14-16 are weighted accordingly.

Specifically, the size of transistors forming the current sources are increased or decreased within a range of approximately ±40%.

For example, when the first quadrant is expressed in eight equal divisions:
θ0=0.00°, θ1=11.25°, θ2=22.50°, θ3=33.75°, ... , θ7=78.75°, θ8=90.00°, θN can be calculated from:

$$\tan^{-1}(Qn/In)=\theta N \quad (1)$$

where the lengths of I vector is In, the length of Q vector is Qn, and N=1 to 7. For example, when N=1, the size of the current source can be determined from:

$$\tan^{-1}(Qn/In)=\tan^{-1}(i_Q/i_{total}-i_Q)=11.25°.$$

Here, $i_Q$ is the current of one of the current sources that supplies the operating current to the differential pair 12-3 and $i_{total}$ is the total current of the current sources 14-1 to 14-16. Currents of other current sources can be determined by repeating this calculation.

The same applies to the cases of the second to fourth quadrants, except that I and Q vectors in the first quadrant are replaced with Q and Ib vectors in the second quadrant, with Ib and Qb vectors in the third quadrant, and with Qb and I vectors in the fourth quadrant. In fact, the weighting of currents of the current sources to achieve the uniform phase steps in the first quadrant ensures the uniform phase steps in the other quadrants.

Figure 11:
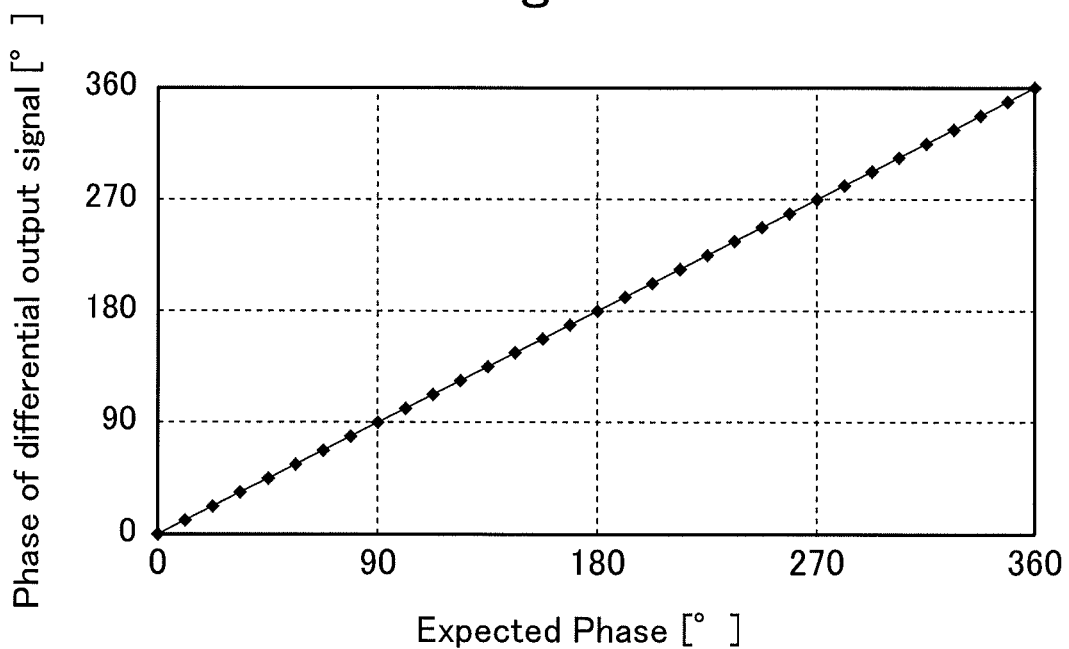
FIG. 11 shows a relationship between the phase of differential output signal and the phase expected by the control code in another exemplary phase interpolator having uniform phase steps according to this disclosure.

FIG. 11 shows a relationship between the phase of differential output signal and the phase expected by the control code in an exemplary phase interpolator in which currents of the current sources are weighted to make the phase steps uniform. In FIG. 11, the vertical axis indicates the actual phase of differential output signal [°], and the horizontal axis indicates the phase expected by the control code [°].

As shown in this graph, phases of differential output signal and expected phases are the same. In addition, intervals between the closed squares, which represent steps between phases of differential output signals corresponding to successive values of the control code, are uniform. That is, a range of the phase from 0° to 360° is divided with uniform phase steps, and a linearly between the phase of differential output signal and the value of control code is improved.

The exemplary phase interpolator 10 having the stabilizing capacitors significantly reduces the error between the phase expected by the control code and the actual phase of differential output signal. Further, currents of the current sources 14-1 to 14-16 are weighted to make the phase steps uniform and enables to improve the linearity between the phase of differential output signal and the value of control code.

An exemplary phase interpolator 10 shown in FIG. 1 was actually used in a circuitry operating in 3 GHz frequency band. The capacitance of each of the stabilizing capacitors 28-1 to 28-4 was approximately 250 fF, which was about five times larger than the maximum value of the parasitic capacitance 26 connected to the source coupled node.

A circuit simulation indicates that amplitude of voltage fluctuation at the source coupled node was approximately 120 mV before the stabilizing capacitors are added, and that of the voltage fluctuation with the same amplitude of input signals was reduced to 20 mV after the stabilizing capacitors are added. The influence of parasitic capacitance was sufficiently suppressed to a degree that the phase error is negligible. The stabilizing capacitors did not require an unacceptably large area. That is, the total footprint of the four stabilizing capacitors 28-1 to 28-4 was approximately the same as the footprint of one current source.

The capacitance of the stabilizing capacitors required for reducing the phase error depends on various factors. Nonetheless, the capacitance of the stabilizing capacitors may be appropriately determined by evaluating the maximum parasitic capacitance that may be connected to source coupled nodes of the differential pairs, the voltage fluctuation at the source coupled nodes, and so on.

While the invention of this disclosure has been described with reference to specific embodiments thereof that are proposed as examples, it is evident that many alternatives, modifications, and variations will be apparent to those skilled in the art. Accordingly, embodiments of the invention as set forth herein are intended to be illustrative, not limiting. There are changes that may be made without departing from the scope of the invention.

What is claimed is:

1. A phase interpolator, comprising:
a first, a second, a third, and a fourth differential pair each including a first and a second transistor having sources coupled with each other to form a source coupled node, each of the differential pairs further including a stabilizing capacitor connected between the source coupled node and a reference voltage;
a plurality of current sources; and
a group of switches having a plurality of connection patterns to switch connections between the source coupled nodes of the differential pairs and the plurality of current sources so that (i) a first operating current is supplied to the source coupled node of a first selected one of the first and second differential pairs and (ii) a second operating current is supplied to the source coupled node of a second selected one of the third and fourth differential pairs, wherein:
gates of the first and second transistors in the first differential pair receive a first input signal having a first phase and a second input signal having a second phase opposite to the first phase, respectively;
gates of the first and second transistors in the second differential pair receive the second input signal and the first input signal, respectively;
gates of the first and second transistors in the third differential pair receive a third input signal having a third phase between the first and second phases and a fourth input signal having a fourth phase opposite to the third phase, respectively;
gates of the first and second transistors in the fourth differential pair receive the fourth input signal and the third input signal, respectively; and
drains of the first transistors in the differential pairs are commonly connected to a first load resistor to form a first output node and drains of the second transistors in the differential pairs are commonly connected to a second load resistor to form a second output node so that a differential output signal is output from the first and second output nodes.

2. The phase interpolator according to claim 1, wherein:
a parasitic capacitance connected to the source coupled node of each of the differential pairs varies up to a maximum capacitance value depending on the connection patterns of the group of switches; and
the stabilizing capacitor in each of the differential pairs has a capacitance equal to or larger than the maximum capacitance value of the parasitic capacitance connected to the source coupled node of the same differential pair.

3. The phase interpolator according to claim 1, wherein:
a parasitic capacitance connected to the source coupled node of each of the differential pairs varies up to a maximum capacitance value depending on the connection patterns of the group of switches; and
the stabilizing capacitor in each of the differential pairs has a capacitance equal to or larger than twice the maximum capacitance value of the parasitic capacitance connected to the source coupled node of the same differential pair.

4. The phase interpolator according to claim 1, wherein:
a parasitic capacitance connected to the source coupled node of each of the differential pairs varies up to a maximum capacitance value depending on the connection patterns of the group of switches; and
the stabilizing capacitor in each of the differential pairs has a capacitance equal to or larger than five times the maximum capacitance value of the parasitic capacitance connected to the source coupled node of the same differential pair.

5. The phase interpolator according to claim 1, wherein:
a parasitic capacitance connected to the source coupled node of each of the differential pairs varies up to a maximum capacitance value depending on the connection patterns of the group of switches; and
the stabilizing capacitor of each of the differential pairs has a capacitance that reduces an amplitude of voltage fluctuation at the source coupled node of the same differential pair to which the parasitic capacitance having the maximum capacitance value is connected to ½ or less compared with a case that the stabilizing capacitor is not connected.

6. The phase interpolator according to claim 1, wherein:
a parasitic capacitance connected to the source coupled node of each of the differential pairs varies up to a maximum capacitance value depending on the connection patterns of the group of switches; and
the stabilizing capacitor of each of the differential pairs has a capacitance that reduces an amplitude of voltage fluctuation at the source coupled node of the same differential pair to which the parasitic capacitance having the maximum capacitance value is connected to ⅕ or less compared with the case that the stabilizing capacitor is not connected.

7. The phase interpolator according to claim 1, wherein:
a parasitic capacitance connected to the source coupled node of each of the differential pairs varies up to a maximum capacitance value depending on the connection patterns of the group of switches; and
the stabilizing capacitor of each of the differential pairs has a capacitance that reduces an amplitude of voltage fluctuation at the source coupled node of the same differential pair to which the parasitic capacitance having the maximum capacitance value is connected to 1/10 or less compared with the case that the stabilizing capacitor is not connected.

8. The phase interpolator according to claim 1, wherein the group of switches includes first switches that select the first and second selected ones of the differential pairs and second switches that connect each of the plurality of current sources to supply one of the first and second operating currents.

9. The phase interpolator according to claim 8, wherein:
the first and second operating current vary up to a first and a second maximum operating current, respectively, depending on the connection patterns of the group of switches; and
the stabilizing capacitor of each of the differential pairs has a capacitance that reduces an amplitude of voltage fluctuation at the source coupled node of the same differential pair to which corresponding one of the first and second maximum operating currents is supplied to ½ or less compared with the case that the stabilizing capacitor is not connected.

10. The phase interpolator according to claim 8, wherein:
the first and second operating current vary up to a first and a second maximum operating current, respectively, depending on the connection patterns of the group of switches; and
the stabilizing capacitor of each of the differential pairs has a capacitance that reduces an amplitude of voltage fluctuation at the source coupled node of the same differential pair to which corresponding one of the first and second maximum operating currents is supplied to ⅕ or less compared with the case that the stabilizing capacitor is not connected.

11. The phase interpolator according to claim 8, wherein:
the first and second operating current vary up to a first and a second maximum operating current, respectively, depending on the connection patterns of the group of switches; and
the stabilizing capacitor of each of the differential pairs has a capacitance that reduces an amplitude of voltage fluctuation at the source coupled node of the same differential pair to which corresponding one of the first and second maximum operating currents is supplied to ¹/₁₀ or less compared with the case that the stabilizing capacitor is not connected.

12. The phase interpolator according to claim 1, wherein the stabilizing capacitors in the first and second differential pairs have a first same capacitance and the stabilizing capacitors in the third and fourth differential pairs have a second same capacitance.

13. The phase interpolator according to claim 12, wherein:
a parasitic capacitance connected to the source coupled node of each of the differential pairs varies up to a maximum capacitance value depending on the connection patterns of the group of switches; and
the stabilizing capacitor in each of the differential pairs has a capacitance equal to or larger than the maximum capacitance value of the parasitic capacitance connected to the source coupled node of the same differential pair.

14. The phase interpolator according to claim 12, wherein:
a parasitic capacitance connected to the source coupled node of each of the differential pairs varies up to a maximum capacitance value depending on the connection patterns of the group of switches; and
the stabilizing capacitor in each of the differential pairs has a capacitance equal to or larger than twice the maximum capacitance value of the parasitic capacitance connected to the source coupled node of the same differential pair.

15. The phase interpolator according to claim 12, wherein:
a parasitic capacitance connected to the source coupled node of each of the differential pairs varies up to a maximum capacitance value depending on the connection patterns of the group of switches; and
the stabilizing capacitor in each of the differential pairs has a capacitance equal to or larger than five times the maximum capacitance value of the parasitic capacitance connected to the source coupled node of the same differential pair.

16. The phase interpolator according to claim 12, wherein:
a parasitic capacitance connected to the source coupled node of each of the differential pairs varies up to a maximum capacitance value depending on the connection patterns of the group of switches; and
the stabilizing capacitor of each of the differential pairs has a capacitance that reduces an amplitude of voltage fluctuation at the source coupled node of the same differential pair to which the parasitic capacitance having the maximum capacitance value is connected to ½ or less compared with a case that the stabilizing capacitor is not connected.

17. The phase interpolator according to claim 12, wherein:
a parasitic capacitance connected to the source coupled node of each of the differential pairs varies up to a maximum capacitance value depending on the connection patterns of the group of switches; and
the stabilizing capacitor of each of the differential pairs has a capacitance that reduces an amplitude of voltage fluctuation at the source coupled node of the same differential pair to which the parasitic capacitance having the maximum capacitance value is connected to ⅕ or less compared with a case that the stabilizing capacitor is not connected.

18. The phase interpolator according to claim 12, wherein:
a parasitic capacitance connected to the source coupled node of each of the differential pairs varies up to a maximum capacitance value depending on the connection patterns of the group of switches; and
the stabilizing capacitor of each of the differential pairs has a capacitance that reduces an amplitude of voltage fluctuation at the source coupled node of the same differential pair to which the parasitic capacitance having the maximum capacitance value is connected to ¹/₁₀ or less compared with a case that the stabilizing capacitor is not connected.

19. The phase interpolator according to claim 12, wherein the group of switches includes first switches that select the first and second selected ones of the differential pairs and second switches that connect each of the plurality of current source to supply one of the first and second operating currents.

20. The phase interpolator according to claim 19, wherein:
the first and second operating current vary up to a first and a second maximum operating current, respectively, depending on the connection patterns of the group of switches; and
the stabilizing capacitor of each of the differential pairs has a capacitance that reduces an amplitude of voltage fluctuation at the source coupled node of the same differential pair to which corresponding one of the first and second maximum operating currents is supplied to ½ or less compared with the case that the stabilizing capacitor is not connected.

21. The phase interpolator according to claim 19, wherein:
the first and second operating current vary up to a first and a second maximum operating current, respectively, depending on the connection patterns of the group of switches; and
the stabilizing capacitor of each of the differential pairs has a capacitance that reduces an amplitude of voltage fluctuation at the source coupled node of the same differential pair to which corresponding one of the first and second maximum operating currents is supplied to ⅕ or less compared with the case that the stabilizing capacitor is not connected.

22. The phase interpolator according to claim 19, wherein:
the first and second operating current vary up to a first and a second maximum operating current, respectively, depending on the connection patterns of the group of switches; and
the stabilizing capacitor of each of the differential pairs has a capacitance that reduces an amplitude of voltage fluctuation at the source coupled node of the same differential pair to which corresponding one of the first and second maximum operating currents is supplied to 1/10 or less compared with the case that the stabilizing capacitor is not connected.

23. A method of phase interpolation comprising:
providing a first, a second, a third, and a fourth differential pair each including a first and a second transistor having sources coupled with each other to form a source coupled node;
providing a plurality of current sources;
supplying a first operating current to the source coupled node of a first selected one of the first and second differential pairs and a second operating current to the source coupled node of a second selected one of the third and fourth differential pairs by switching connection between the source coupled nodes of the differential pairs and the plurality of current sources;
inputting a first input signal having a first phase and a second input signal having a second phase opposite to the first phase to gates of the first and second transistors, respectively, in the first differential pair;
inputting the second input signal and the first input signal to gates of the first and second transistors, respectively, in the second differential pair;
inputting a third input signal having a third phase between the first and second phases and a fourth input signal having a fourth phase opposite to the third phase to gates of the first and second transistors, respectively, in the third differential pair;
inputting the fourth input signal and the third input signal to gates of the first and second transistors, respectively, in the fourth differential pair;
outputting a differential output signal from a first and a second output node, which are formed by commonly connecting drains of the first transistors in the differential pairs to a first load resistor and by commonly connecting drains of the second transistors in the differential pairs to a second load resistor, respectively; and
reducing an amplitude of voltage fluctuation at the source coupled node of each of the differential pairs by connecting a stabilizing capacitor between the source coupled nodes of each of the differential pairs and a reference voltage.

24. The method according to claim 23, wherein:
the supplying includes varying a parasitic capacitance connected to the source coupled node of each of the differential pairs up to a maximum capacitance value; and
the reducing includes reducing the amplitude of voltage fluctuation at the source coupled node of each of the differential pairs to which the parasitic capacitance having the maximum capacitance value is connected to 1/2 or less compared with a case that the stabilizing capacitor is not connected.

25. The method according to claim 23, wherein:
the supplying includes varying a parasitic capacitance connected to the source coupled node of each of the differential pairs up to a maximum capacitance value; and
the reducing includes reducing the amplitude of voltage fluctuation at the source coupled node of each of the differential pairs to which the parasitic capacitance having the maximum capacitance value is connected to 1/5 or less compared with a case that the stabilizing capacitor is not connected.

26. The method according to claim 23, wherein:
the supplying includes varying a parasitic capacitance connected to the source coupled node of each of the differential pairs up to a maximum capacitance value; and
the reducing includes reducing the amplitude of voltage fluctuation at the source coupled node of each of the differential pairs to which the parasitic capacitance having the maximum capacitance value is connected to 1/10 or less compared with a case that the stabilizing capacitor is not connected.

27. The method according to claim 23, wherein:
the supplying includes varying the first and second operating currents up to a first and a second maximum operating current, respectively, depending on the connection patterns of the group of switches; and
the reducing includes reducing the amplitude of voltage fluctuation at the source coupled node of each of the differential pairs to which corresponding one of the first and second maximum operating currents is supplied to 1/2 or less compared with the case that the stabilizing capacitor is not connected.

28. The method according to claim 23, wherein:
the supplying includes varying the first and second operating currents up to a first and a second maximum operating current, respectively, depending on the connection patterns of the group of switches; and
the reducing includes reducing the amplitude of voltage fluctuation at the source coupled node of each of the differential pairs to which corresponding one of the first and second maximum operating current is supplied to 1/5 or less compared with the case that the stabilizing capacitor is not connected.

29. The method according to claim 23, wherein:
the supplying includes varying the first and second operating currents up to a first and a second maximum operating current, respectively, depending on the connection patterns of the group of switches; and
the reducing includes reducing the amplitude of voltage fluctuation at the source coupled node of each of the differential pairs to which corresponding one of the first and second maximum operating current is supplied to 1/10 or less compared with the case that the stabilizing capacitor is not connected.

* * * * *